(12) United States Patent
Solon

(10) Patent No.: US 8,937,249 B2
(45) Date of Patent: *Jan. 20, 2015

(54) SOLAR ENERGY WIRE HARNESS WITH IN-LINE FUSES

(75) Inventor: Dean Solon, Gallatin, TN (US)

(73) Assignee: Shoals Technologies Group, LLC, Portland, TN (US)

( * ) Notice: Subject to any disclaimer, the term of this patent is extended or adjusted under 35 U.S.C. 154(b) by 902 days.

This patent is subject to a terminal disclaimer.

(21) Appl. No.: 12/714,855

(22) Filed: Mar. 1, 2010

(65) Prior Publication Data

US 2011/0209741 A1 Sep. 1, 2011

(51) Int. Cl.
| | | |
|---|---|---|
| H01L 31/042 | (2014.01) |
| H02B 1/20 | (2006.01) |
| H02G 3/04 | (2006.01) |
| H02G 3/16 | (2006.01) |
| H01H 85/02 | (2006.01) |
| H01H 85/20 | (2006.01) |
| H02G 3/08 | (2006.01) |
| H01L 31/05 | (2014.01) |

(52) U.S. Cl.
CPC .............. *H02G 3/16* (2013.01); *H01H 85/0241* (2013.01); *H01H 85/201* (2013.01); *H02G 3/083* (2013.01); *H01L 31/05* (2013.01); *Y02E 10/50* (2013.01)
USPC ......................... 174/72 A; 174/84 R; 136/244

(58) Field of Classification Search
CPC . H01L 31/0485; H01L 31/05; H01L 31/0504; H01L 31/0508
See application file for complete search history.

(56) References Cited

U.S. PATENT DOCUMENTS

| | | | |
|---|---|---|---|
| 4,410,930 A * | 10/1983 | Yachabach | 362/145 |
| 5,335,160 A | 8/1994 | Savoca | |
| 6,259,027 B1 * | 7/2001 | Watanabe | 174/72 A |
| 6,870,089 B1 | 3/2005 | Gray | |
| 7,275,967 B1 | 10/2007 | Olliff | 439/654 |
| 2004/0115991 A1 * | 6/2004 | Higuchi et al. | 439/621 |
| 2004/0144043 A1 * | 7/2004 | Stevenson et al. | 52/173.3 |
| 2005/0217888 A1 * | 10/2005 | Arai et al. | 174/72 A |
| 2008/0099062 A1 | 5/2008 | Armstrong et al. | |
| 2009/0194143 A1 | 8/2009 | Jacobs et al. | |
| 2010/0139733 A1 * | 6/2010 | Jonczyk et al. | 136/244 |

OTHER PUBLICATIONS

Yamaichi Electronics; YSOL Junction Boxes and Cable Connectors for Silicon WAfer and Thin Film Modules; 2009; accessed Aug. 22, 2014; http://www.manudax.fr/download/Yamaichi_y-sol_09_Brochure.pdf; pp. 1-5.*

* cited by examiner

*Primary Examiner* — Jeffrey T Barton
*Assistant Examiner* — Edward Schmiedel
(74) *Attorney, Agent, or Firm* — Carla Gannon Law

(57) ABSTRACT

A wire harness connects multiple solar panel junction boxes to a recombiner box. The wire harness includes in-line fuse assemblies, with optional blocking diodes, so each string of solar panels is associated with one fuse. In the event of a blown fuse, only one upstream solar panel string is affected. Entire wire harnesses and/or individual in-line fuse assemblies can be easily swapped out, thereby decreasing the time and expense of troubleshooting and repairing.

16 Claims, 7 Drawing Sheets

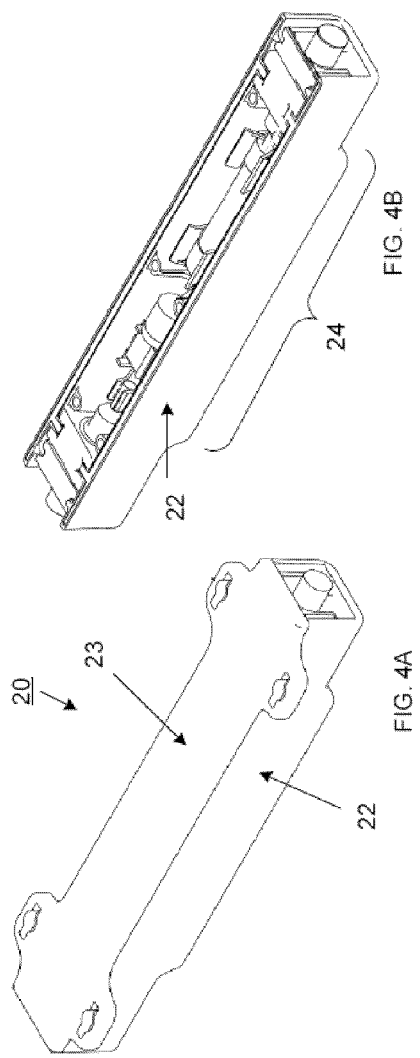
FIG. 4A
FIG. 4B
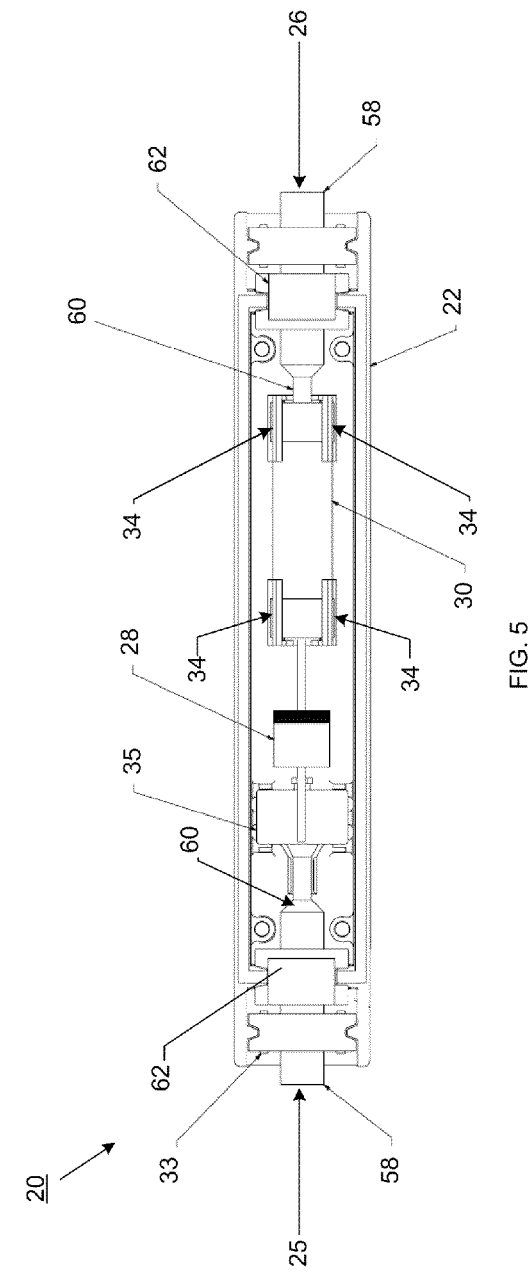
FIG. 5

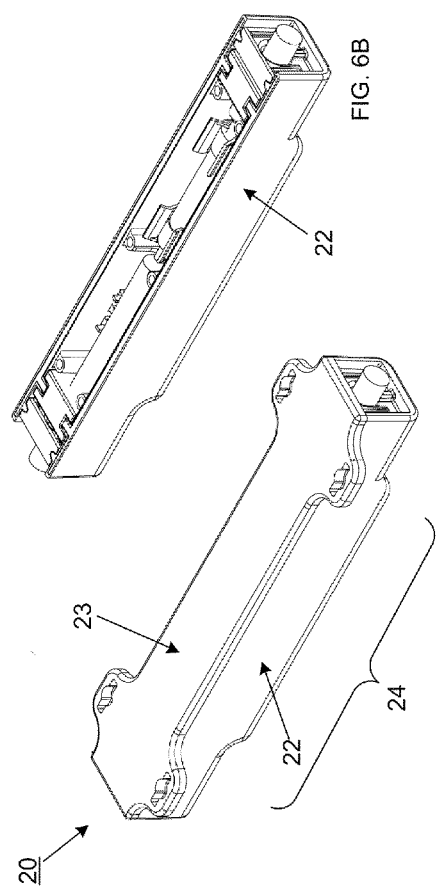
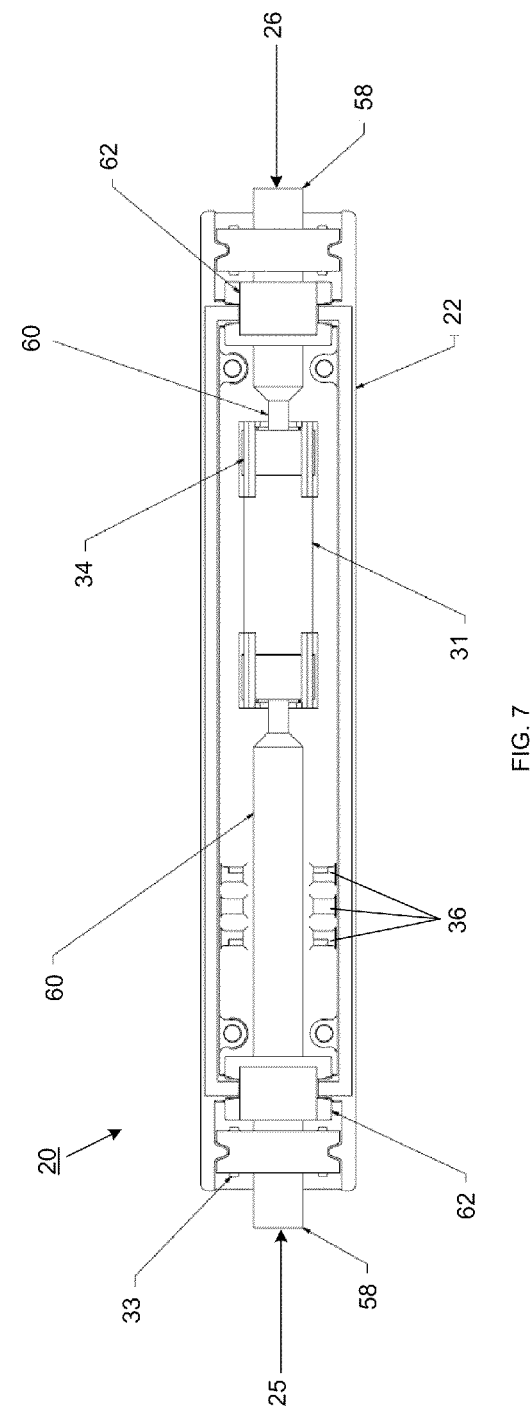

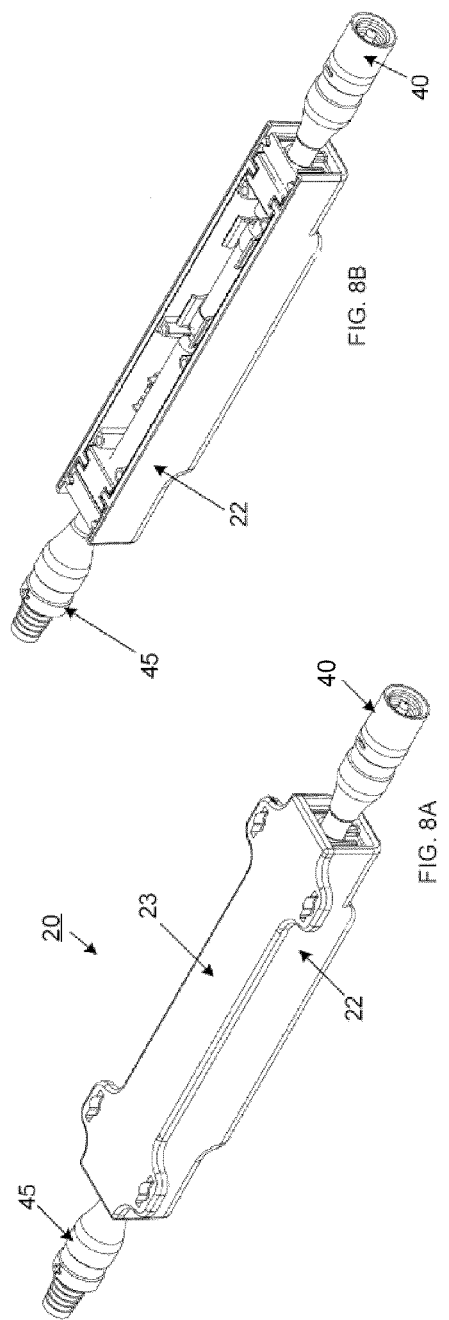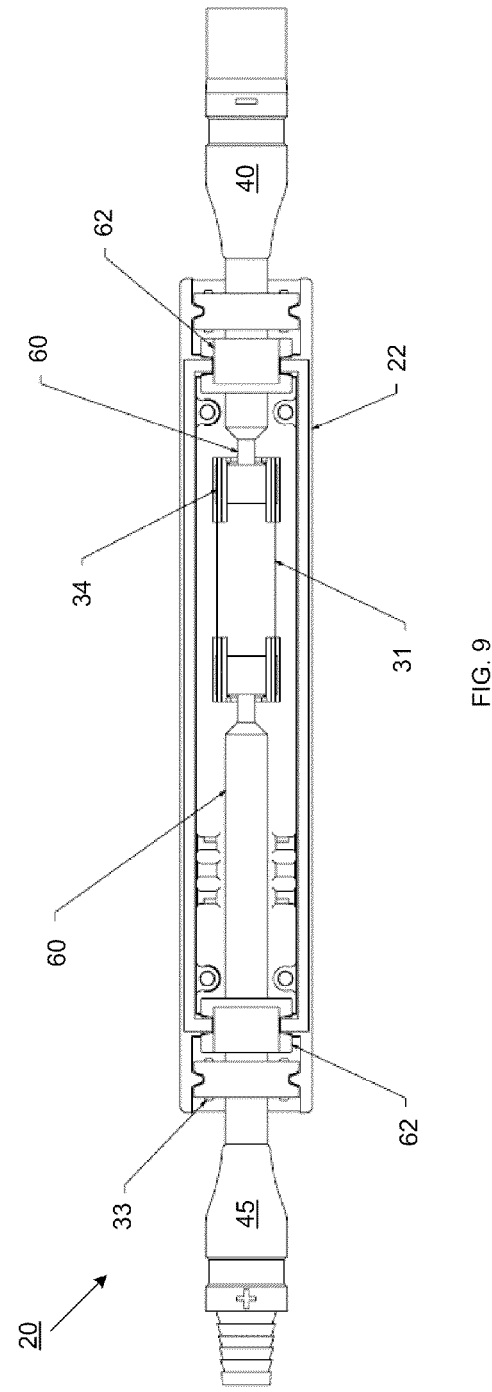

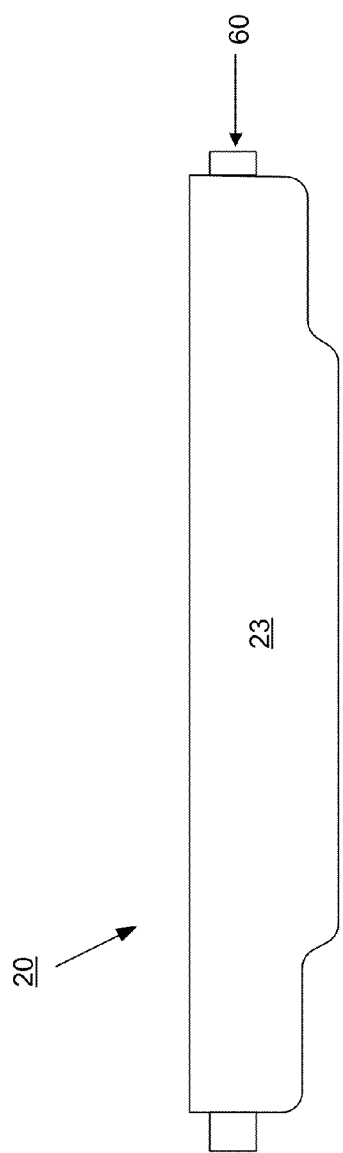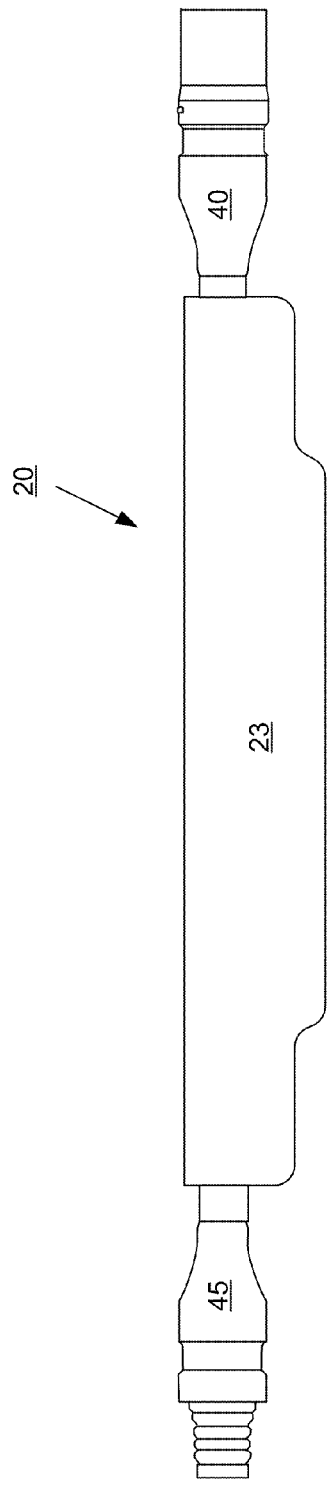
FIG. 10
FIG. 11

SOLAR ENERGY WIRE HARNESS WITH IN-LINE FUSES

BACKGROUND (1) Field

The present invention relates generally to components used in the solar energy industry and, more particularly, to wire harnesses with in-line fuses for electrically coupling solar panel junction boxes to recombiner boxes.

(2) Related Art

The problems associated with the world's dependence on non-renewable resources have resulted in increased attention to so-called alternative energy, such as solar and wind power. As a result, small-scale production of alternative energy, for example by installing residential solar heaters or wind turbines, has become more popular. While these actions may provide psychological and possible long-term financial benefits, the actual contribution to the power grid is minimal. Permanent and significant changes necessitate the implementation of alternative energy generation on a large-scale utility basis.

Utility scale production of solar energy, however, is often considered financially imprudent given the high cost of materials, know-how, and labor. For example, conventionally wiring solar panels typically requires a qualified electrician to measure, cut, connect and crimp wires on site, by hand, between each individual solar panel's junction box and the combiner box that conventionally contains the fuses. In addition, the resulting combiner box is a confusing array of electronics that often requires extensive labor and expense for troubleshooting and repairing. Also, a blown fuse will result in the shut down of an array of solar panels, thus decreasing the productivity of the system.

Accordingly, the interests of being environmentally responsible often conflict with the financial realities of building and maintaining a solar energy plant.

Thus, there remains a need for components for use in solar plants that decrease the materials, know-how and/or labor associated with building and maintaining the electrical infrastructure.

There also remains a need for components for use in solar plants that are easily identified as problematic, and replaced, in the event of a failure.

A need also exists for components that prevent the loss of energy in the event of a failure.

Moreover, a need exists for a solar wiring architecture which does not shut down more solar panels than necessary in the event of a failure.

Ideally, these components are relatively simple, safe and inexpensive to manufacture, transport and use.

Methods of using the aforementioned components, and creating the aforementioned architecture, are also needed.

SUMMARY OF THE INVENTIONS

The present inventions are directed to wire harnesses for electrically connecting multiple solar panel junction boxes to a recombiner box. The wire harnesses are capable of handling high voltage, low current power, and can be configured in a variety of ways. Each branch of a wire harnesses connects to the junction box of a solar panel, with each of the branches including an in-line fuse assembly. The multiple branches of the wire harness feed into a common wire harness trunk. The terminal end of each branch and trunk includes a positive or negative connector, to facilitate easy installation or replacement by mating with a corresponding connector on a junction box or recombiner box. The in-line fuse assembly may include a variety of fuse types, such as midget fuses and/or 1000V fuses, and may optionally include a blocking diode. The in-line fuse assembly may also include connectors, so that individual fuses may be swapped out in the event a fuse is blown, versus replacing the entire wire harness. One of the advantages of this invention over conventional wiring is that the fuses are not in the combiner box. Accordingly, when a fuse is blown, only one solar array is affected. When a fuse of a conventional combiner box is blown, all panels downstream from that fuse are affected.

BRIEF DESCRIPTION OF THE DRAWING

FIG. 4 is a perspective view of an in-line fuse assembly with diode, with the lid intact (A) and removed (B);

FIG. 5 is the top view of an in-line fuse assembly with diode, without a lid;

FIG. 6 is a perspective view of an in-line fuse assembly, with the lid intact (A) and removed (B);

FIG. 7 is the top view of an in-line fuse assembly, without a lid;

FIG. 8 is a perspective view of an in-line fuse assembly with connectors, with the lid intact (A) and removed (B);

FIG. 9 is the top view of an in-line fuse assembly with connectors, without a lid;

FIG. 10 is a side view of an in-line fuse assembly; and

FIG. 11 is a side view of an in-line fuse assembly with connectors.

DESCRIPTION OF THE PREFERRED EMBODIMENTS

Figure 1:
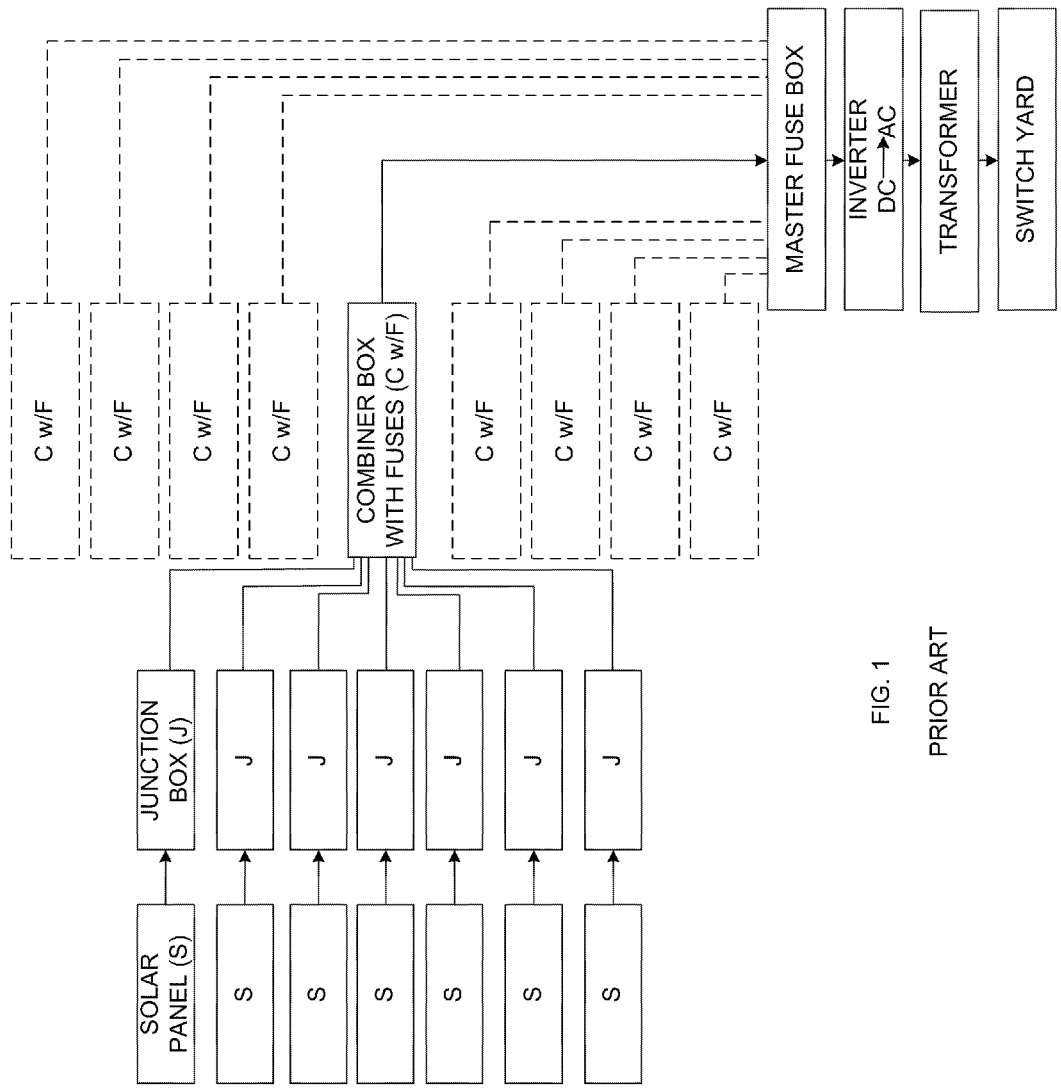
FIG. 1 schematically represents a conventionally wired solar energy system.

In the following description, like reference characters designate like or corresponding parts throughout the several views. It should be understood that the illustrations are for the purpose of describing a preferred embodiment of the inventions and are not intended to limit the inventions thereto.

Figure 2:
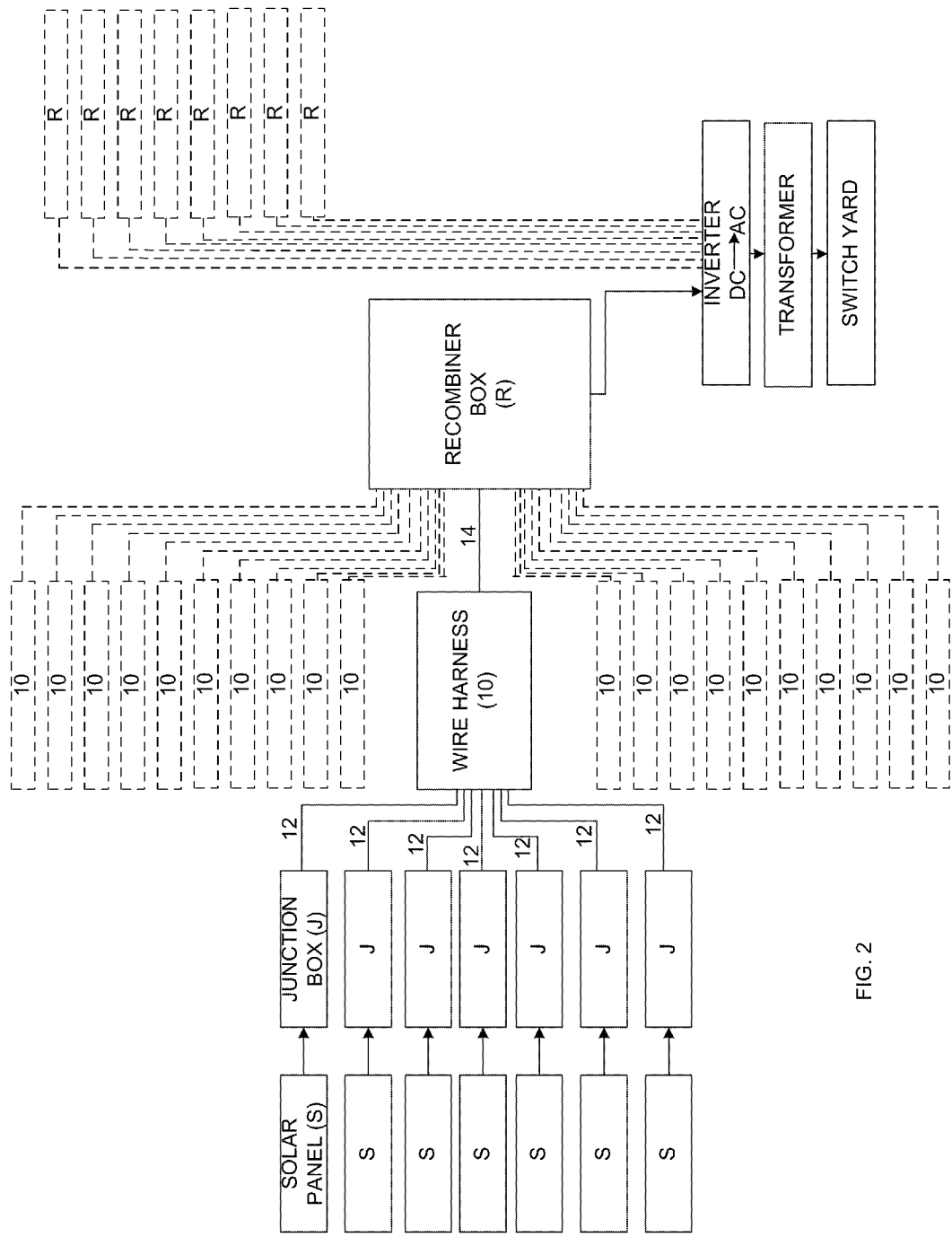
FIG. 2 schematically represents a solar energy system wired according to the present invention.

A "big picture" presentation of a solar energy plant according to the present invention is depicted in FIG. 2. Following the flow of energy, the major components are the solar panels S, junction boxes J, wire harnesses 10, recombiner boxes R, inverter (DC to AC), transformer, and switch yard. Each solar panel S is connected to a junction box J, which may be integrated or separate. Each junction box J is in communication with one branch 12 of wire harness 10 (see FIG. 3), typically with 6-12 branches, and 12 branches per wire harness being preferred. Each wire harness has one trunk 14, which is in communication with a recombiner box R.

Recombiner box R preferably accommodates 12-24 trunks 14, corresponding with 12-24 individual wire harnesses 10, as schematically represented in FIG. 2 as "phantom" wire harnesses 10. Recombiner box R is in communication with an inverter, preferably with 6 gauge wire. The inverter preferably accommodates 8-10 recombiner boxes R, as indicated by the "phantom" recombiner boxes R connected to the inverter.

Conventionally, combiner boxes contain fuses (C w/F), as shown in FIG. 1. In the present invention, however, fuses are upstream of the "combiner box" (recombiner box R), in wire harnesses 10. Accordingly, recombiner box R of the present invention is preferably devoid of fuses.

Figure 3:
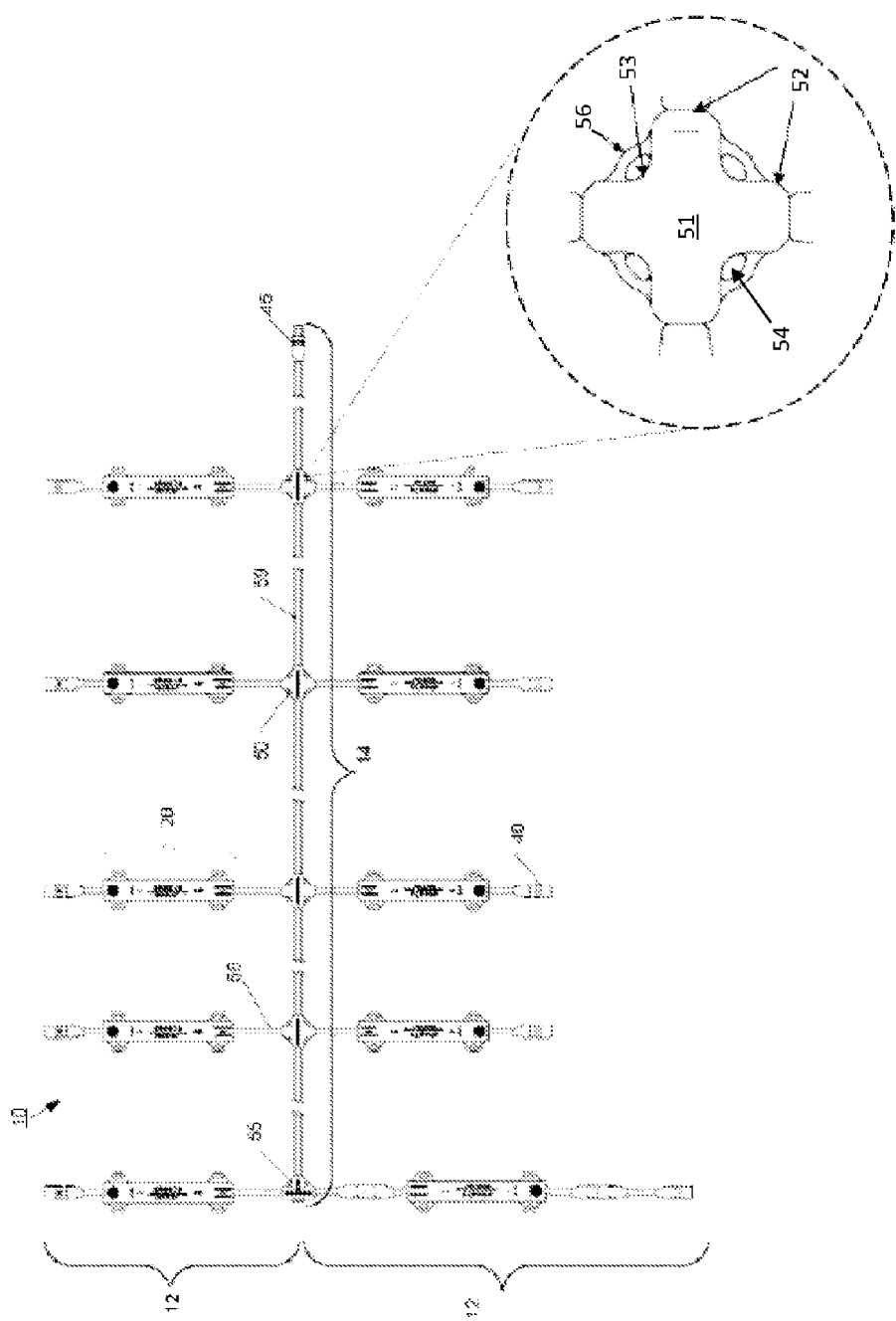
FIG. 3 depicts a wire harness of the present invention.

Referring now to FIG. 3, wire harness 10 includes a plurality of branches 12 feeding into one trunk 14. Preferably branches 12 are constructed of 10 or 12 gauge photovoltaic wire, with Southwire of Carrolton, Georgia being most preferred, and trunks 14 are constructed of 10 or 8 gauge photovoltaic wire, with Southwire of Carrolton, Georgia being most preferred. Branches 12 preferably terminate in connectors, with negative connectors 40 being most preferred. Trunk 14 preferably terminates in a connector, with positive connector 45 being most preferred. Branches 12 connect to trunk 14 with cross joints 50, or tee joints 55, with the former uniting four wires and the latter uniting three. Trunk 14 is divided by joints into multiple trunk segments 59. FIG. 3 depicts a cross joint in exploded view, including encasement 51 having four protrusions 52, vertices 53 formed at bases of protrusions, and securing apertures 54 at the vertices. Securing apertures 54 have a perimeter partially defined by spanning member 56 connecting one of said protrusions 52 to another of said protrusions. Securing apertures are particularly well suited for receiving fasteners such as zip ties, for holding the assembly in the field. While the cross joint is described, it should be understood that corresponding structures exist on other joints, such as tee joints, as well. These joints are disclosed in U.S. patent application Ser. No. 12/502,395, which was filed Jul. 14, 2009, and issued into U.S. Pat. No. 8,604,342, on Dec. 10, 2013, which is incorporated herein in its entirety. Various combinations of joints and connectors are capable of yielding a variety of wire harness 10 configurations. These various configurations are within the scope of the present invention.

Branches 12 of wire harness 10 each include one in-line fuse assembly 20, so wire harness 10 includes a plurality of in-line fuse assemblies 20 connected to branch wire 58, which is preferably photovoltaic wire. These assemblies 20 are separated one-from-another by cross joints 50 or tee joints 55. Wire harness 10 is capable of withstanding high voltage, low current power. As used herein, "high voltage, low current power" means a voltage between 500V and 1500V, and a current between 2A and 60A; with voltage and current between 600V and 1200V, and 2A and 30A, respectively, being more preferred; and between 600V and 1000B, and 2A and 20A being most preferred.

FIGS. 4-5 depict one embodiment of in-line fuse assembly 20, the in-line fuse assembly with a diode. Specifically, referring to FIG. 4A, assembled in-line fuse assembly 20 is encased on three sides by housing 22, and covered on a fourth side by lid 23. When lid 23 is removed, FIG. 4B, the structure of the various components are visible within housing 22. Preferably, lid 23 and housing 22 are constructed of polypropylene, by conventional methods such as injection molding. Preferably housing 22 is approximately 138.5 mm long, 22.0 mm tall including flange 24, 17.0 mm tall not including flange 24, 22 mm wide, and having walls 2.0 mm thick. Preferably lid 23 is 138.5 mm long, 3 mm tall, 41 mm wide. In constructing in-line fuse assembly 20, it is desirable to construct the device within housing 22, then position lid 23 to encase the assembly. Housing 22 and lid 23 are preferably held together by ultrasonic weld or screws. Other embodiments of in-line fuse assembly 20, with and without lid 23, are similarly depicted in FIGS. 6A, 6B, 8A and 8B.

Turning now to FIG. 5, this embodiment of in-line fuse assembly 20 includes, from left to right, input 25 constructed of assembly wire 60, which is held in position by wire clip 33, which is integrated into the housing 22. As with all embodiments, assembly wire 60 may be the same as branch wire 58, except it is considered directly associated with in-line fuse assembly 20. Preferably assembly wire 60 is 10 or 12 gauge, with Southwire of Carrolton, Ga. being most preferred. In this embodiment, a "stub" of branch wire 58 is attached to assembly 20 via wire grommet 62, with assembly wire 60 in communication with crimp connector 35, and blocking diode 28. Diode 28 preferably has an ampacity of 2 to 30 amps, and is commercially available as P600 from Vishay of Shelton, Conn.

Downstream from diode 28 in the embodiment is midget fuse 30, which is held in position by fuse clips 34, which are integrated with housing 22. Midget fuse 30 preferably has an ampacity of 2 to 30 amps, and is commercially available as an ATM fuse from Ferraz-Shawmut of Newburyport, Mass. Grommet 62 locates assembly wire 60, which connects to midget fuse 30 by fuse clip 34, and is output 26 of assembly 20. Grommets 62 protect housing-22 and lid-23 encased assembly 20 from ambient.

The in-line fuse with diode embodiment, as depicted in FIGS. 4 and 5, as well as other embodiments discussed herein, provide multiple structural differences and functional advantages over conventional solar industry components. Specifically, by employing a wire harness versus conventional hard wiring, the labor costs and failure rates are significantly decreased. This is because a trained technician can plug in the appropriate parts, versus an electrician performing conventional hard wiring methods. Also, when fuse 20 needs to be replaced, it is possible to simply isolate and swap out a bad fuse for a good one on harness 10, rather than dealing with the combiner box C w/f, which can be more difficult to diagnose, and more hazardous and complex. By positioning fuse 20 upstream of recombiner box R, one blown fuse merely shuts off power flowing from the single associated solar panel S, versus shutting down power flowing from all solar panels connected to the portion of the associated recombiner box. This drastically decreases the negative impact of "down time", thereby improving the efficiency of the total solar field. Also, the master fuse box is eliminated, thereby simplifying and cutting costs. Moreover, by providing a blocking diode, energy can not reverse the flow and drain power from the system.

FIGS. 6-7 depict another embodiment of in-line fuse assembly 20, the in-line fuse assembly without a diode. This embodiment is similar to the embodiment of FIGS. 4-5, except that it doesn't have crimp connector 35 or diode 28. Assembly wire 60 is longer, and can include 1000V fuse 31, which is commercially available as DCT series from Ferraz-Shawmut of Newburyport, Mass.

FIGS. 8-9 set forth yet another embodiment of in-line fuse assemblies 20, the in-line fuse assembly with connectors. By including negative connector 40 and positive connector 45, it is possible to easily "swap out" in-line fuse assembly 20 in the field, in the event of a blown fuse or other failure. Although FIGS. 8B and 9 depict assembly 20 without diode 28, it is possible to include diode 28, depending on the requirements. The bottom left branch 12 of FIG. 3 illustrates the embodiment of an in-line fuse assembly 20 including connectors 40, 45 used in wire harness 10.

Referring back to FIG. 2, in use, one would electrically connect junction box J of solar panel S to recombiner box R by plugging, for example, negative connector 40 (shown in FIG. 3) at distal end of branch 12 of wire harness 10 into junction box J. Similarly, each branch 12 of wire harness 10 would be plugged into a different junction box J, with each junction box J associated with one solar panel S. Positive connector 45 of trunk 14 would connect to central recombiner box R. In this manner, a plurality of solar panels S, with an equal number of junction boxes J, would be connected by an equal number of branches 12 to trunk 14. Trunk 14 would be electrically connected to recombiner box R. In this manner, the number of trunks 14 would equal the number of wire harnesses 10. The solar panel S would be positioned to collect solar energy. Wire harnesses 10 would include at least one in-line fuse assembly 20, with each in-line fuse assembly including a fuse, for example midget fuse 30 or 1000V fuse 31, and optionally diode 28. Negative connector 40 and/or positive connector 45 could also be employed to provide "plug and play" functionality. When the embodiment including connectors (FIGS. 8 and 9) is used, it might not be necessary to unplug wire harness 10 from junction box J when in-line fuse assembly 20 requires replacement. Rather, in-line fuse assembly 20 could be "swapped out" for a replacement in-line fuse assembly.

By way of working example, a solar energy field using in-line fuse assembly 20 could be set up as follows: 2304 solar panels are connected to 16 recombiner boxes, primarily using the in-line fuse assembly, which is generally depicted in FIG. 5, which is commercially available as the STG-SHP-2X12P.M3 wire harness assembly from Shoals Technologies Group of Portland, Tenn. Accordingly, each wire harness assembly includes eight branches 12 feeding into each trunk 14. The solar panel/junction box assemblies are commercially available from Sharp Electronics Corporation of Huntington Beach, Calif. as NA-128H5, and the recombiner boxes are commercially available from Blue Oak PV Products of Davis, Calif. as HCB12. Branches 12 and trunk 14 are constructed of 10 and 10 gauge wire, respectively. The output of the recombiner flows directly to the DC-to-AC inverter. In this manner, each branch 12 carries a maximum of 1000V and 2 A, and each trunk 14 carries a maximum of 1000V and 16 A, the total maximum output per recombiner box is 1000 V and 192A, and the total maximum output of the DC-to-AC inverter is 3 MW. In the event one solar panel P stops collecting energy, or fuse 30 or 31 is blown, the entire system output would only be decreased by 2A, or 0.06%.

Certain modifications and improvements will occur to those skilled in the art upon a reading of the foregoing description. By way of example, the fuse only version can be placed in a shorted housing. It should be understood that all such modifications and improvements have been deleted herein for the sake of conciseness and readability but are properly within the scope of the following claims.

I claim:

1. A wire harness for high voltage, low current power, said wire harness including:
   a) photovoltaic wire;
   b) a plurality of in-line fuse assemblies connected in pairs of exactly two to said photovoltaic wire, each of said in-line fuse assemblies in each pair being positioned at the same linear position as the other of said in-line fuse assembly of the pair on said photovoltaic wire;
   c) a plurality of joints separating said in-line fuse assemblies one-from-another; and
   d) a plurality of encasements, each encasement of the plurality of encasements surrounding a different joint in the plurality of joints, wherein each encasement defines protrusions that form at least one vertex, and each encasement defines a securing aperture positioned at said vertex.

2. The wire harness of claim 1 wherein at least one of said in-line fuse assemblies includes a blocking diode.

3. The wire harness of claim 1 further including at least one negative connector engaged with said photovoltaic wire.

4. The wire harness of claim 1 wherein said securing aperture has a perimeter partially defined by a spanning member connecting one of said protrusions to another of said protrusions.

5. The wire harness of claim 1 wherein at least one of said in-line fuse assemblies includes a 2-20 amp fuse.

6. The wire harness of claim 1 wherein one of said in-line fuse assemblies includes a 600V or 1000V DC fuse.

7. The wire harness of claim 1 wherein said in-line fuse assemblies each include a protective housing.

8. The wire harness of claim 1 wherein said photovoltaic wire is between 8 gauge and 12 gauge.

9. eviously Amended) The wire harness of claim 4 wherein said encasements include at least one cross joint and/or at least one tee joint.

10. A wire harness for electrically coupling a solar panel junction box to a recombiner box, said wire harness including:
    a) a trunk constructed of photovoltaic wire;
    b) a plurality of branches located in pairs of exactly two with each branch having a proximal end and a distal end, said proximal ends each directly connected to said trunk at a joint surrounded by an encasement that defines a plurality of protrusions forming at least one vertex, wherein each encasement defines a securing aperture positioned at said vertex with each of said branches in each pair being positioned at the same linear position as the other of said branches of the pair on said photovoltaic wire;
    c) a plurality of connectors each connected at the distal end of said branches; and
    d) a plurality of in-line fuse assemblies each connected to one of said branches.

11. The wire harness of claim 10 wherein each of said in-line fuse assemblies is positioned separately from each of said connectors.

12. The wire harness of claim 10 wherein each of said in-line fuse assemblies includes a 3-sided housing and flat-sided lid.

13. The wire harness of claim 12 wherein said 3-sided housing and said flat-sided lid are constructed of polypropylene.

14. The wire harness of claim 12 wherein said 3-sided

15. The wire harness of claim 10 further including a midget fuse having an ampacity of 2 to 30 amps.

16. The wire harness of Claim 10 wherein said encasement defines at least one securing aperture has a perimeter partially defined by a spanning member connecting one of said protrusions to another of said protrusions.

* * * * *